US010854242B2

(12) United States Patent
Shabbir et al.

(10) Patent No.: US 10,854,242 B2
(45) Date of Patent: Dec. 1, 2020

(54) INTELLIGENT DUAL INLINE MEMORY MODULE THERMAL CONTROLS FOR MAXIMUM UPTIME

(71) Applicant: Dell Products L.P., Round Rock, TX (US)

(72) Inventors: Hasnain Shabbir, Round Rock, TX (US); Vadhiraj Sankaranarayanan, Austin, TX (US); Amit Sumanlal Shah, Austin, TX (US); Mark Andrew Dykstra, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 181 days.

(21) Appl. No.: 16/054,971

(22) Filed: Aug. 3, 2018

(65) Prior Publication Data
US 2020/0043529 A1 Feb. 6, 2020

(51) Int. Cl.
| G06F 11/00 | (2006.01) |
| G11C 5/04 | (2006.01) |
| G06F 1/20 | (2006.01) |
| G06F 11/30 | (2006.01) |
| G06F 11/07 | (2006.01) |
| G11C 11/4078 | (2006.01) |

(52) U.S. Cl.
CPC ............... *G11C 5/04* (2013.01); *G06F 1/206* (2013.01); *G06F 11/0727* (2013.01); *G06F 11/3058* (2013.01); *G11C 11/4078* (2013.01)

(58) Field of Classification Search
CPC ............. G06F 11/0727; G06F 11/0754; G06F 11/2284; G06F 11/3058
See application file for complete search history.

(56) References Cited

U.S. PATENT DOCUMENTS

| 7,304,905 | B2* | 12/2007 | Hsu | G06F 1/206 365/212 |
| 7,765,825 | B2* | 8/2010 | Wyatt | G11C 5/00 62/259.2 |
| 8,381,064 | B2* | 2/2013 | Hazelzet | H03M 13/19 365/189.05 |
| 8,418,005 | B2* | 4/2013 | Depew | G11C 29/50 714/718 |
| 8,566,624 | B2* | 10/2013 | Johnson | G06F 1/26 713/300 |
| 9,915,984 | B2* | 3/2018 | Berke | H03M 13/19 365/189.05 |

(Continued)

*Primary Examiner* — Elmira Mehrmanesh
(74) *Attorney, Agent, or Firm* — Baker Botts L.L.P.

(57) ABSTRACT

A dual in-line memory module (DIMM) thermal control system for intelligent DIMM thermal controls for maximum uptime may include a memory subsystem. The memory subsystem may include a first DIMM and a first serial presence detect (SPD) module associated with the first DIMM. The DIMM thermal control system may also include a baseboard management controller (BMC). The BMC may, when a first DIMM failure of the first DIMM may be detected, record a first failure event in a first failure events log of the first SPD module. The first failure event may comprise the first DIMM failure and associated first thermal telemetry data of the first DIMM. The BMC may also adjust DIMM thermal control settings to reduce temperature of the first DIMM based on the first failure events log including at least the first failure event.

18 Claims, 5 Drawing Sheets

(56) References Cited

U.S. PATENT DOCUMENTS

| | | | |
|---|---|---|---|
| 2008/0103634 A1* | 5/2008 | Santos | G05D 23/19 700/299 |
| 2009/0055157 A1* | 2/2009 | Soffer | G06F 15/7864 703/27 |
| 2009/0150721 A1* | 6/2009 | Kochar | G06F 11/1008 714/6.11 |
| 2012/0095719 A1* | 4/2012 | Araki | G01K 13/00 702/130 |
| 2015/0006967 A1* | 1/2015 | Dang | G06F 1/3225 714/39 |
| 2016/0048347 A1* | 2/2016 | Rangarajan | G06F 11/2092 711/156 |
| 2016/0055058 A1* | 2/2016 | Zheng | G06F 11/10 714/764 |
| 2017/0149880 A1* | 5/2017 | Lochhead | G06F 9/00 |
| 2017/0308447 A1* | 10/2017 | Wu | G11C 5/00 62/259.2 |
| 2017/0351308 A1* | 12/2017 | Rangarajan | G06F 1/206 365/212 |
| 2018/0300273 A1* | 10/2018 | Lambert | G06F 11/1048 |
| 2019/0129777 A1* | 5/2019 | Rangarajan | G06F 11/1048 |

* cited by examiner

500 — METHOD FOR INTELLIGENT DUAL INLINE MEMORY MODULE
THERMAL CONTROLS FOR MAXIMUM UPTIME

WHEN A FIRST DIMM FAILURE OF A FIRST DIMM OF A MEMORY SUBSYSTEM OF A DIMM THERMAL CONTROL SYSTEM MAY BE DETECTED, RECORDING, BY A BASEBOARD MANAGEMENT CONTROLLER (BMC) OF THE DIMM THERMAL CONTROL SYSTEM, A FIRST FAILURE EVENT IN A FIRST FAILURE EVENTS LOG OF A FIRST SERIAL PRESENCE DETECT (SPD) MODULE OF THE MEMORY SUBSYSTEM ASSOCIATED WITH THE FIRST DIMM — 502

ADJUSTING, BY THE BMC, DIMM THERMAL CONTROL SETTINGS TO REDUCE TEMPERATURE OF THE FIRST DIMM BASED ON THE FIRST FAILURE EVENTS LOG INCLUDING AT LEAST THE FIRST FAILURE EVENT — 504

FIG. 5

INTELLIGENT DUAL INLINE MEMORY MODULE THERMAL CONTROLS FOR MAXIMUM UPTIME

BACKGROUND

Field of the Disclosure

This disclosure relates generally to information handling systems and, more particularly, to intelligent dual inline memory module (DIMM) thermal controls for maximum uptime.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed dual in-line memory module (DIMM) thermal control system may include a memory subsystem. The memory subsystem may include a first DIMM and a first serial presence detect (SPD) module associated with the first DIMM. The DIMM thermal control system may also include a baseboard management controller (BMC). The BMC may, when a first DIMM failure of the first DIMM may be detected, record a first failure event in a first failure events log of the first SPD module. The first failure event may comprise the first DIMM failure and associated first thermal telemetry data of the first DIMM. The BMC may also adjust DIMM thermal control settings to reduce temperature of the first DIMM based on the first failure events log including at least the first failure event.

In a number of the disclosed embodiments of the DIMM thermal control system, the DIMM thermal control system may also include a basic input/output system (BIOS). The BIOS may, prior to the first DIMM failure of the first DIMM being detected, scan the first SPD module for the first failure events log. The BIOS may also, when the first failure events log may be found within the first SPD module and the first failure events log may comprise at least a second failure event, send an indicator to the BMC indicating that a second DIMM failure of the second failure event has been detected. The second failure event further may comprise second thermal telemetry data of the first DIMM associated with the second DIMM failure. The BMC may set the DIMM thermal control settings to set the temperature of the first DIMM based on the indicator received from the BIOS that may indicate that the second DIMM failure of the second failure event has been detected and the first failure events log includes at least the second failure event.

In a number of the disclosed embodiments of the DIMM thermal control system, the memory subsystem may also include a second DIMM proximate the first DIMM. The BMC may set the DIMM thermal control settings to set the temperature of the second DIMM based on the first failure events log including at least the first failure event. The second DIMM proximate the first DIMM within the memory subsystem.

In a number of the disclosed embodiments of the DIMM thermal control system, the DIMM thermal control system may also include a central processing unit (CPU) coupled to the memory subsystem. The BMC may set CPU thermal control settings to set the temperature of the CPU based on the first failure events log that may include at least the first failure event.

In a number of the disclosed embodiments of the DIMM thermal control system, the first failure events log of the first SPD module may comprise a DIMM temperature during a warning threshold, a DIMM temperature during a critical threshold, a number of DIMM excursions exceeding an excursions limit, a number of times a DIMM temperature has exceed a temperature threshold, a number of warning excursions within one or more warning temperature ranges, and a number of critical excursions within one or more critical temperature ranges.

In a number of the disclosed embodiments of the DIMM thermal control system, the adjustment of the DIMM thermal control settings to reduce the temperature of the first DIMM may further comprise one or more of a reduction of a DIMM fan control target by a fan control reduction amount, a reduction of a DIMM closed loop thermal throttling (CLTT) high temperature value by a CLTT reduction amount, and a reduction of a CPU cooling target by a cooling reduction amount.

In a number of the disclosed embodiments of the DIMM thermal control system, the adjustment of the DIMM thermal control settings to reduce temperature of the first DIMM may be further based on health parameters of the first DIMM.

In a number of the disclosed embodiments of the DIMM thermal control system, the health parameters may comprise a number of spare DIMMs remaining, past temperature excursions of the first DIMM, and on-die error correcting code (ECC) error occurrences of the first DIMM.

In a number of the disclosed embodiments of the DIMM thermal control system, the first DIMM failure may comprises one or more of a correctable error and an uncorrectable error.

In a number of the disclosed embodiments of the DIMM thermal control system, after the first failure event has been recorded in the first failure events log, the BMC may also, when a consecutive error count of the first failure events log may exceed a consecutive error count threshold, reset the consecutive error count to zero.

In a second embodiment, a disclosed method may include, when a first dual in-line memory module (DIMM) failure of a first DIMM of a memory subsystem of a DIMM thermal control system may be detected, recording, by a baseboard management controller (BMC) of the DIMM thermal control system, a first failure event in a first failure events log of a first serial presence detect (SPD) module of the memory subsystem associated with the first DIMM. The first failure event may comprise the first DIMM failure and associated first thermal telemetry data of the first DIMM. The method may also include adjusting, by the BMC, DIMM thermal control settings to reduce temperature of the first DIMM based on the first failure events log including at least the first failure event.

In a number of the disclosed embodiments of the method, the method may also include, prior to the first DIMM failure of the first DIMM being detected, scanning, by a basic input/output system (BIOS) of the DIMM thermal control system, the first SPD module for the first failure events log. The method may further include, when the first failure events log may be found within the first SPD module and the first failure events log comprises at least a second failure event, sending, by the BIOS, an indicator to the BMC indicating that a second DIMM failure of the second failure event may have been detected. The second failure event may further comprise second thermal telemetry data of the first DIMM associated with the second DIMM failure. The method may also include setting, by the BMC, the DIMM thermal control settings to set the temperature of the first DIMM based on the indicator received from the BIOS indicating that the second DIMM failure of the second failure event has been detected and the first failure events log may include at least the second failure event.

In a number of the disclosed embodiments of the method, the method may also include, setting, by the BMC, the DIMM thermal control settings to set the temperature of a second DIMM of the memory subsystem based on the first failure events log including at least the first failure event. The second DIMM proximate the first DIMM within the memory subsystem. The second DIMM proximate the first DIMM.

In a number of the disclosed embodiments of the method, the method may also include, setting, by the BMC, CPU thermal control settings to set the temperature of a central processing unit (CPU) of the DIMM thermal control system based on the first failure events log including at least the first failure event.

In a number of the disclosed embodiments of the method, the first failure events log of the first SPD module may further include a DIMM temperature during a warning threshold, a DIMM temperature during a critical threshold, a number of DIMM excursions exceeding an excursions limit, a number of times a DIMM temperature has exceed a temperature threshold, a number of warning excursions within one or more warning temperature ranges, and a number of critical excursions within one or more critical temperature ranges.

In a number of the disclosed embodiments of the method, adjusting the DIMM thermal control settings to reduce the temperature of the first DIMM may further comprise one or more of reducing a DIMM fan control target by a fan control reduction amount, reducing a DIMM closed loop thermal throttling (CLTT) high temperature value by a CLTT reduction amount, and reducing a CPU cooling target by a cooling reduction amount.

In a number of the disclosed embodiments of the method, adjusting the DIMM thermal control settings to reduce temperature of the first DIMM may be further based on health parameters of the first DIMM.

In a number of the disclosed embodiments of the method, the health parameters may comprise a number of spare DIMMs remaining, past temperature excursions of the first DIMM, and on-die error correcting code (ECC) error occurrences of the first DIMM.

In a number of the disclosed embodiments of the method, the first DIMM failure may include one or more of a correctable error and an uncorrectable error.

In a number of the disclosed embodiments of the method, the method may also include, after the first failure event has been recorded in the first failure events log, when a consecutive error count of the first failure events log may exceed a consecutive error count threshold, resetting the consecutive error count to zero.

BRIEF DESCRIPTION OF THE DRAWINGS

For a more complete understanding of the present invention and its features and advantages, reference is now made to the following description, taken in conjunction with the accompanying drawings, in which:

FIG. 5 is a flowchart depicting selected elements of an embodiment of a method for intelligent dual inline memory module thermal controls for maximum uptime.

DESCRIPTION OF PARTICULAR EMBODIMENT(S)

Figure 1:
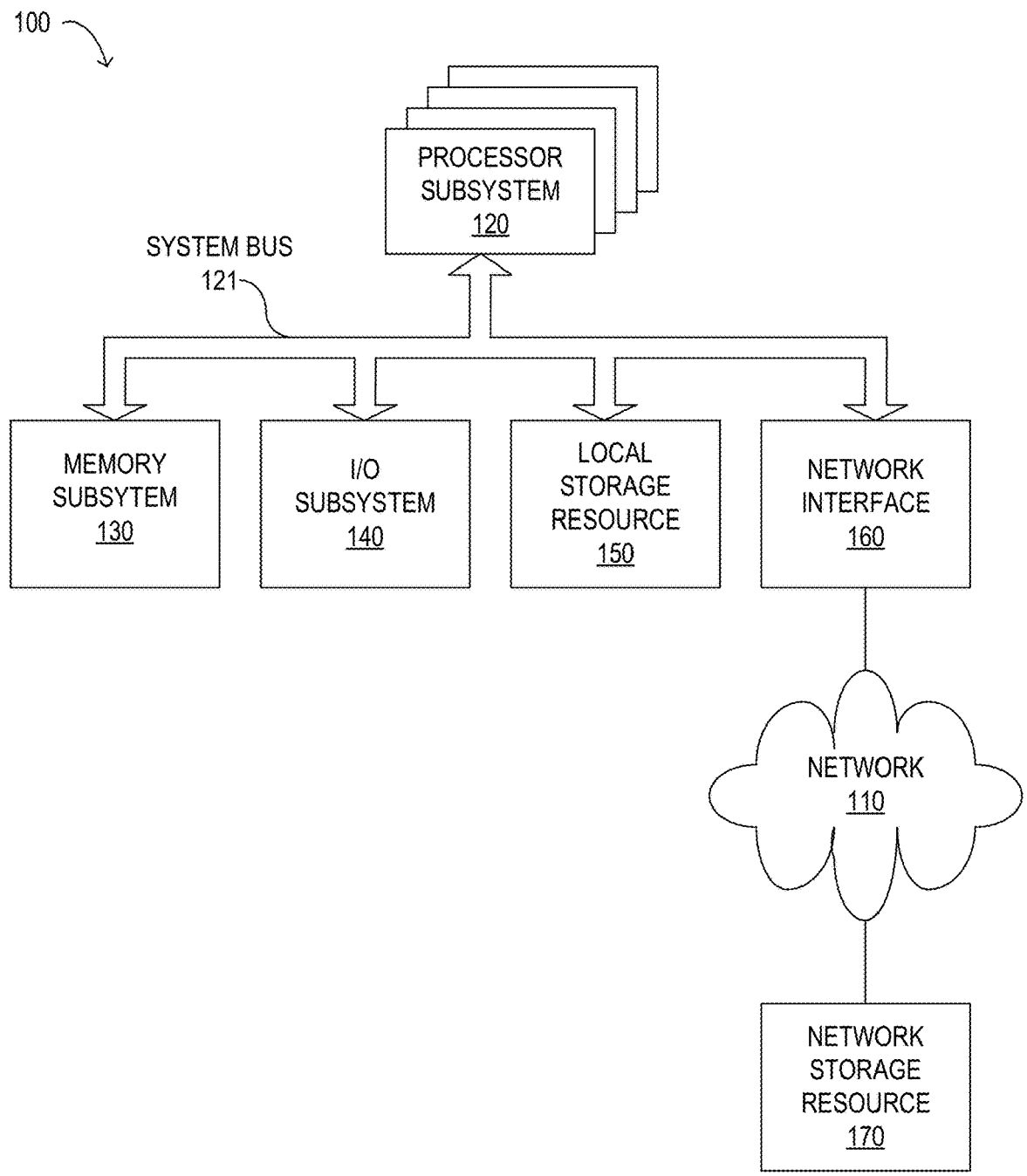
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1, 2, 3, 4, and 5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Typical memory subsystems may include dynamic random access memory (DRAM) based dual in-line memory modules (DIMMs). In future generations of memory subsystems, the memory devices will comprise persistent memory devices co-existing with DRAM based DIMM memory devices. Persistent memory devices such as PCRAM and RRAM have different thermal tolerance limits than DRAM based DIMMs. System configurations are also becoming more dense and with higher channel interface speeds between a CPU and the DIMMs, which will result in higher average system temperatures and hence higher risk of errors in the memory subsystem. Current thermal control strategy for optimum fan power consumption results in higher average DRAM temperatures that are still within specifications. Thus, higher speed and dense system configurations will also tend to run, on average, at higher temperatures. These higher temperatures can cause higher DRAM-cell leakage, which may induce memory cell errors. As memory geometries continue to shrink these issues are exacerbated. However, real-time mechanisms to relate these issues to real systems do not exist and there is no memory error event data to help understand potential linkage or lack thereof.

As will be described in further detail herein, the inventors of the present disclosure have discovered systems and methods for intelligent DIMM thermal controls for maximum uptime. In this solution, a DIMM thermal control system may record thermal telemetry of DIMMs in a DIMM SPD module as DIMM failures are encountered. Additional SPD fields within the SPD module may allow other key DIMM performance parameters associated with each DIMM failure to be recorded in DIMM failure event records when the DIMM failure events occur. The DIMM thermal control system may utilize the thermal telemetry data and DIMM performance parameters to dynamically adjust DIMM fan control and CLTT settings based on current and earlier failure event driven record during both boot-time and run-time operation to maximize uptime. Since the CLTT setting can be applied on an individual DIMM or individual channel basis, vulnerable or weak DIMMs and potentially neighboring DIMMs may be targeted to decrease the risk of issues of failures.

Figure 2:
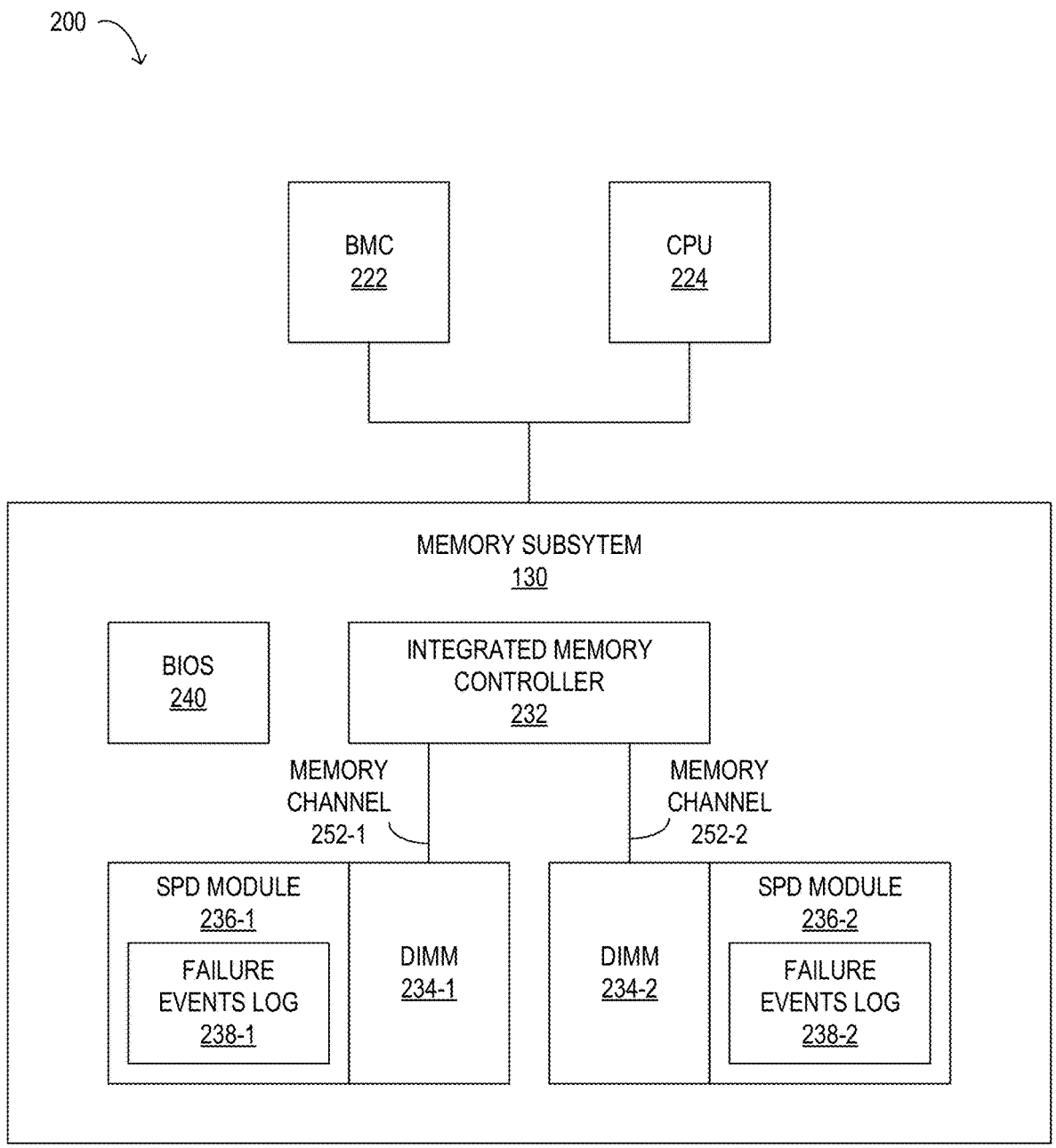
FIG. 2 is a block diagram of selected elements of an embodiment of an exemplary DIMM thermal control system.

Turning now to FIG. 2, a block diagram of selected elements of an embodiment of an exemplary DIMM thermal control system 200 for intelligent DIMM thermal controls for maximum uptime is illustrated. As shown in FIG. 2, components of DIMM thermal control system 200 may include, but are not limited to, a storage subsystem 201. Storage subsystem 201 may include memory subsystem 130, a baseboard management controller (BMC) 222, and a central processing unit 224. Memory subsystem 130 may further include an integrated memory controller 232, DIMMs 234 including a DIMM 234-1 and a DIMM 234-2, serial presence detect (SPD) modules 236 including a SPD module 236-1 and a SPD module 236-2, a basic input/output system (BIOS) 240 that may reside in system memory of memory subsystem 130, and memory channels 252 including a memory channel 252-1 and a memory channel 252-2. SPD module 236-1 may be associated with DIMM 234-1 and SPD module 236-2 may be associated with DIMM 234-2. Integrated memory controller 232 may be coupled to DIMM 234-1 by memory channel 252-1 and DIMM 234-2 by memory channel 252-2. Integrated memory controller 232 may communicate with DIMM 234-1 using memory channel 252-1 and DIMM 234-2 using memory channel 252-2. Integrated memory controller 232 may communicate with memory channels 252-1 and 252-2 through a respective double data rate/double data rate transactional (DDR/DDRT) link. Memory subsystem 130 may be coupled to both BMC 222 and CPU 224.

In some embodiments, each DIMM 234 may comprise at least one error-correcting code (ECC) dual in-line memory module (DIMM). The ECC DIMM may comprise a DDR synchronous dynamic random access memory (SDRAM) module including a DDR first generation (DDR1) SDRAM, a DDR second generation (DDR2) SDRAM, a DDR third generation (DDR3) SDRAM, a DDR4 SDRAM, a DDR5 SDRAM, or another type of DDR memory. ECC is a data protection mechanism which recovers single bit errors and some multi-bit errors by accurate detection and correction of corrupted data. As such, the ECC DIMM can detect and correct the most common kinds of internal data corruption.

Each SPD module 236 may include a respective failure events log 238. SPD module 236-1 may include failure events log 238-1 and SPD module 236-2 may include failure events log 238-2. Each failure events log 238 may include one or more failure events associated with DIMM 234-1. A failure event may comprise a DIMM failure of a respective DIMM 234 and thermal telemetry data of the respective DIMM 234 at the time of the DIMM failure. A DIMM failure may comprise a correctable error, an error correcting code (ECC) correctable error, an uncorrectable error, or another type of error.

Each failure events log 238 may also include a DIMM temperature during a warning threshold, a DIMM temperature during a critical threshold, a number of DIMM excursions exceeding an excursions limit, a number of times a DIMM temperature has exceed a temperature threshold, a number of warning excursions within one or more warning temperature ranges, a number of critical excursions within one or more critical temperature ranges, other failure event information or data, or combinations thereof.

BIOS 240 may comprise firmware for various hardware management tasks including performing hardware initialization during the booting process, power-on startup, gathering DIMM error data information, providing reliability, availability, and serviceability (RAS) services, and providing runtime services for operating systems and programs.

During a system boot of DIMM thermal control system 200, BIOS 240 may scan SPD module 236-1 for failure events log 238-1. When BIOS 240 may find events log 238-1 within SPD module 236-1 and failure events log 238-1 includes at least a second failure event, BIOS 240 may send an indicator to BMC 222 indicating that a second DIMM failure of the second failure event had been detected. The second failure event may be a past failure event that occurred prior to the system boot of DIMM thermal control system 200. The second failure event may also include thermal telemetry history data of DIMM 234-1 associated with the second past DIMM failure at the time of the second DIMM failure. BMC 222 may utilize the thermal telemetry history from past DIMM failures including the second past DIMM failure for setting individual DIMM thermal control settings to set the temperature of DIMM 234-1 based on the indicator received from BIOS 240 that may indicate that the second DIMM failure had been detected and failure events log 238-1 includes at least the second failure event. Setting the individual DIMM thermal control settings may include setting one or more of a DIMM target temperature for fan control of a fan associated with DIMM 234-1, a DIMM closed loop thermal throttling (CLTT) setting, or a CPU cooling target setting.

During run-time operation of DIMM thermal control system 200, a first DIMM failure of DIMM 234-1 may occur. When the first DIMM failure of DIMM 234-1 may be detected, BMC 222 may record a first failure event in failure events log 238-1 of SPD module 236-1. The first failure event may comprise the first DIMM failure and associated thermal telemetry data at the time the failure occurred of DIMM 234-1. BMC 222 may utilize the thermal telemetry data from the first DIMM failure and the thermal telemetry history from past DIMM failures including the second past DIMM failure described above for adjusting DIMM thermal control settings to reduce the temperature of DIMM 234-1 based on failure events log 238-1 including at least the first failure event.

Adjusting the individual DIMM thermal control settings to reduce the temperature of DIMM 234-1 may include reducing one or more of a DIMM fan control target by a fan control reduction amount, a DIMM closed loop thermal throttling (CLTT) high temperature value by a CLTT reduction amount, and a CPU cooling target by a cooling reduction amount. Adjusting the individual DIMM thermal control settings to reduce the temperature of DIMM 234-1 may be further based on health parameters of DIMM 234-1. The health parameters may comprise a number of spare DIMMs remaining, past temperature excursions of DIMM 234-1, and on-die ECC error occurrences of DIMM 234-1.

In some embodiments, DIMM 234-1 and DIMM 234-2 may be proximate each other, e.g. neighboring DIMMs, such that the error behavior of one of DIMMs 234 may be a predictor for the error behavior of the other DIMM 234. BMC 222 may utilize the error behavior of DIMM 234-1 based on failure events log 238-1 including at least the first failure event and the second failure event for DIMM 234-1 to set the DIMM thermal control settings to set the temperature of DIMM 234-2. For example, corresponding memory channels 252 on a 2S/4S configuration may require a set of DIMMs 234 to be targeted to a socket having multiple channels.

In one or more embodiments, BMC 222 may set CPU thermal control settings to set the temperature of CPU 224 based on failure events log 238-1 that may include at least the first failure event and the second failure event for DIMM 234-1.

In one or more embodiments, after the first failure event has been recorded in failure events log 238-1, BMC 222 may reset a consecutive error count to zero when the consecutive error count of failure events log 238-1 may exceed a consecutive error count threshold.

Figure 3:
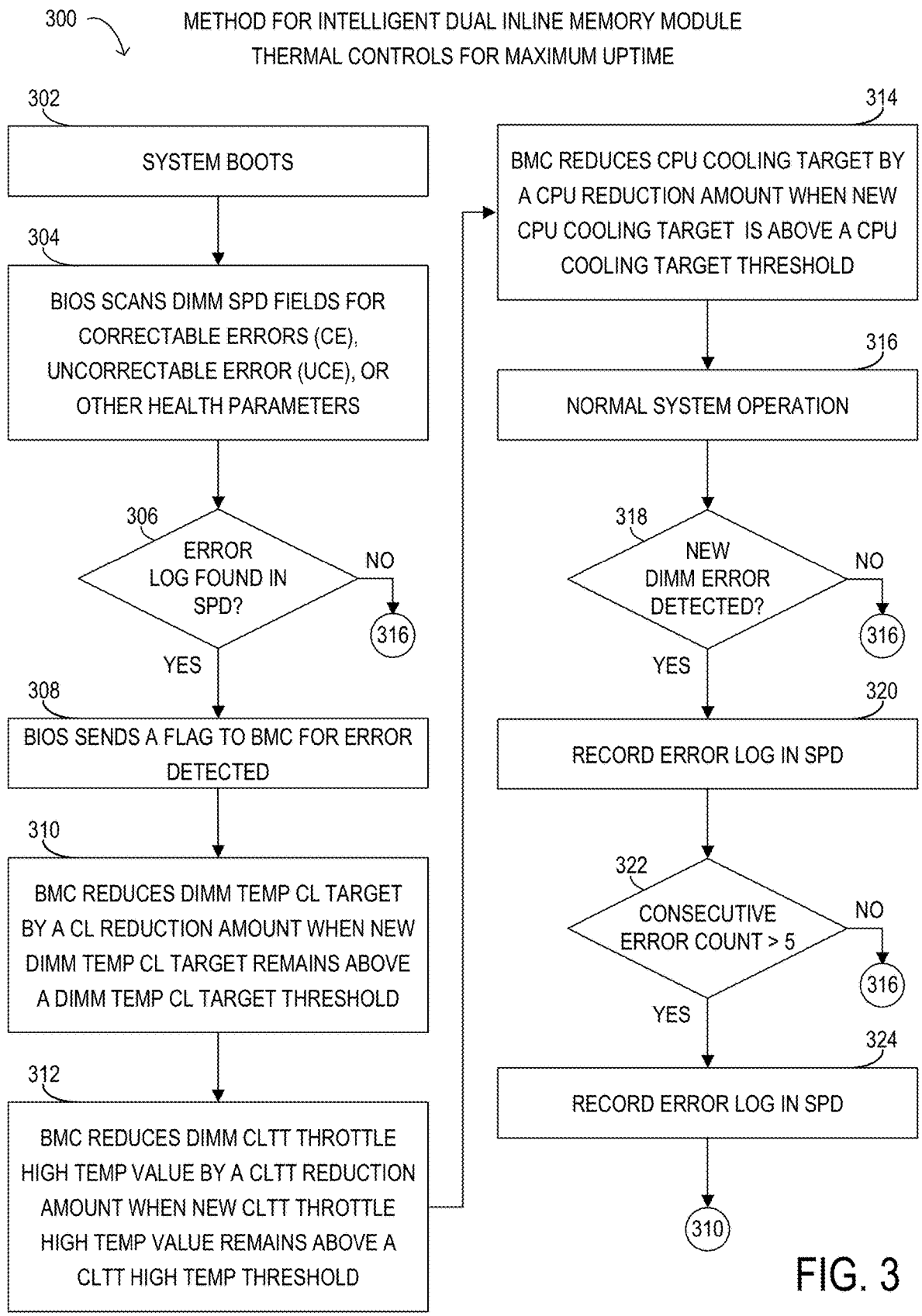
FIG. 3 is a flowchart depicting selected elements of an embodiment of a method for intelligent dual inline memory module thermal controls for maximum uptime.

FIG. 3 is a flowchart depicting selected elements of an embodiment of a method for intelligent dual inline memory module thermal controls for maximum uptime. Method 300 may be performed by a BIOS of an information handling system 100, a baseboard management controller (BMC), previously described with reference to FIGS. 1 and 2. It is noted that certain operations described in method 300 may be optional or may be rearranged in different embodiments.

Method 300 may begin at step 302. At step 302, information handling system 100 may boot up and enter boot-time operation. At step 304, during boot-time operation of information handling system 100, a basic input/output system (BIOS) may scan dual in-line memory module (DIMM) SPD fields of a DIMM for correctable errors, uncorrectable errors, or other health parameters associated with the DIMM. At step 306, BIOS may determine whether an error log was found in the DIMM SPD. When the BIOS determines that the error log was found, method 300 may proceed to step 308. Otherwise method 300 proceeds to step 316. At step 308, BIOS may send a flag to a BMC for error detected. At step 310, BMC may reduce a DIMM temperature CL target by a DIMM temperature CL reduction amount, when a new DIMM temperature CL target remains above a DIMM temperature CL target threshold. In some embodiments, the DIMM temperature CL reduction amount may have a value of 5 degrees Celsius, or another appropriate value, and the DIMM temperature CL target threshold may have a value of 60° C., or another appropriate value. At step 312, BMC may reduce a DIMM closed loop thermal throttling (CLTT) throttle high temperature value by a DIMM CLTT throttle high temperature reduction amount, when a new DIMM CLTT throttle high temperature value remains above a DIMM CLTT throttle high temperature value threshold. In one or more embodiments, the DIMM CLTT throttle high temperature reduction amount may have a value of 3° C., or another appropriate reduction value, and the DIMM CLTT throttle high temperature value threshold may have a value of 85° C., or another appropriate threshold value. At step 314, the BMC may reduce a central processing unit (CPU) cooling target by a CPU cooling target reduction amount, when a new CPU cooling target value remains above a CPU cooling target threshold. In one or more embodiments, the CPU cooling target reduction amount may have a value of 2° C., or another appropriate reduction value, and the CPU cooling target threshold may have a value of the difference between a maximum temperature (DTSMAX) at which the DIMM functionality is guaranteed and 2 times a temperature control value (2×Tcontrol) for long-term reliability of the DIMM, DTSMAX−2×Tcontrol, or another appropriate threshold value. At step 316, information handling system may exit boot-time operation and enter normal system operation. At step 318, during normal system operation, BIOS may determine whether a new DIMM error has been detected. When a new DIMM error has been detected, method 300 may proceed to step 320. Otherwise, method 300 may proceed back to step 316. At step 320, BIOS may record an error log in SPD. At step 322, BIOS may determine whether a consecutive error count has exceeded a consecutive error count threshold. The consecutive error count threshold may have a value of 5, or another appropriate threshold value. When BIOS determines that the consecutive error count has been exceeded, method 300 may proceed to step 324. Otherwise method 300 may proceed back to step 316. At step 324, BIOS may record an error log in SPD. Method 300 may then proceed back to step 310.

Figure 4:
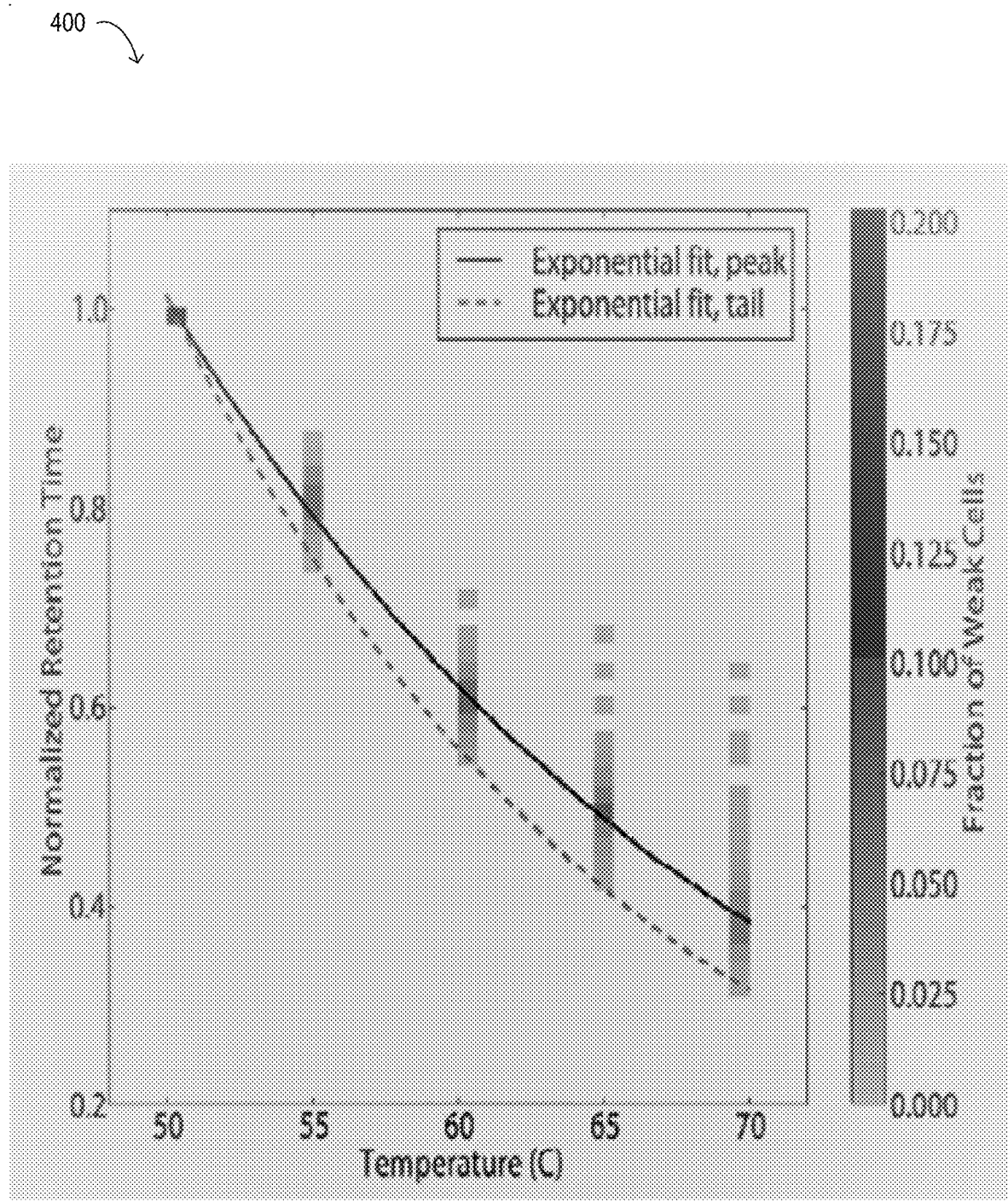
FIG. 4 is a graph depicting DRAM retention time versus temperature.

FIG. 4 is a graph 400 depicting a dynamic random access memory (DRAM) DIMM retention time versus temperature. As shown in graph 400, every 10° C. increase in temperature of the DRAM DIMM device results in a 46.5% reduction in retention time in the worst case. The relationship between retention time and temperature is consistently bounded and predictable within a DRAM DIMM device.

FIG. 5 is a flowchart depicting selected elements of an embodiment of a method 500 for intelligent dual inline memory module thermal controls for maximum uptime. Method 500 may be performed by DIMM thermal control system 200 with reference to FIG. 2. It is noted that certain operations described in method 500 may be optional or may be rearranged in different embodiments.

Method 500 may begin at step 502, by, when a first DIMM failure of a first DIMM of a memory subsystem of a DIMM thermal control system may be detected, recording, by a BMC of the DIMM thermal control system, a first failure event in a first failure events log of a first SPD module of the memory subsystem associated with the first DIMM. The first failure event may comprise the first DIMM failure and associated first thermal telemetry data of the first DIMM. At step 504, adjusting, by the BMC, DIMM thermal control settings to reduce temperature of the first DIMM based on the first failure events log including at least the first failure event.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A dual in-line memory module (DIMM) thermal control system, comprising:
a memory subsystem comprising:
a first DIMM;
a second DIMM;
a first serial presence detect (SPD) module associated with the first DIMM;
a basic input/output system (BIOS) configured to:
prior to a first DIMM failure of the first DIMM being detected:
scan the first SPD module for a first failure events log; and
a baseboard management controller (BMC) configured to:
when the first DIMM failure of the first DIMM is detected:
record a first failure event in the first failure events log of the first SPD module, wherein the first failure event comprises the first DIMM failure and associated first thermal telemetry data of the first DIMM;
adjust first DIMM thermal control settings to reduce a first temperature of the first DIMM based on the first failure events log including at least the first failure event; and
adjust second DIMM thermal control settings to set a second temperature of the second DIMM based on the first failure events log including at least the first failure event.

2. The DIMM thermal control system of claim 1, wherein the BIOS is further configured to:
send an indicator to the BMC indicating that a second DIMM failure of a second failure event has been detected, wherein the second failure event further comprises second thermal telemetry data of the first DIMM associated with the second DIMM failure, and wherein the BMC is further configured to:
set the first DIMM thermal control settings to set the first temperature of the first DIMM based on the indicator received from the BIOS indicating that the second DIMM failure of the second failure event has been detected and the first failure events log including at least the second failure event.

3. The DIMM thermal control system of claim 1, further comprising:
a central processing unit (CPU) coupled to the memory subsystem, wherein
the BMC is further configured to:
set CPU thermal control settings to set the temperature of the CPU based on the first failure events log including at least the first failure event.

4. The DIMM thermal control system of claim 1, wherein the first failure events log of the first SPD module further comprises:
a DIMM temperature during a warning threshold;
a DIMM temperature during a critical threshold;
a number of DIMM excursions exceeding an excursions limit;
a number of times a DIMM temperature has exceed a temperature threshold;
a number of warning excursions within one or more warning temperature ranges; and
a number of critical excursions within one or more critical temperature ranges.

5. The DIMM thermal control system of claim 1, wherein the adjustment of the first DIMM thermal control settings to reduce the first temperature of the first DIMM further comprises one or more of a reduction of a DIMM fan control target by a fan control reduction amount, a reduction of a DIMM closed loop thermal throttling (CLTT) high temperature value by a CLTT reduction amount, and a reduction of a CPU cooling target by a cooling reduction amount.

6. The DIMM thermal control system of claim 1, wherein the adjustment of the first DIMM thermal control settings to reduce first temperature of the first DIMM is further based on health parameters of the first DIMM.

7. The DIMM thermal control system of claim 6, wherein the health parameters comprise:
a number of spare DIMMs remaining;
past temperature excursions of the first DIMM; and
on-die error correcting code (ECC) error occurrences of the first DIMM.

8. The DIMM thermal control system of claim 1, wherein the first DIMM failure comprises one or more of:
a correctable error; and
an uncorrectable error.

9. The DIMM thermal control system of claim 1, wherein after the first failure event has been recorded in the first failure events log, the BMC is further configured to:
when a consecutive error count of the first failure events log exceeds a consecutive error count threshold, reset the consecutive error count to zero.

10. A method, comprising:
prior to a first DIMM failure of a first DIMM of a memory subsystem of a DIMM thermal control system being detected:
scanning, by a basic input/output system (BIOS) of the memory subsystem, a first serial presence detect (SPD) module of the memory subsystem for a first failure events log, the first SPD module associated with the first DIMM; and
when the first DIMM failure of the first DIMM is detected:
recording, by a baseboard management controller (BMC) of the DIMM thermal control system, a first failure event in the first failure events log of the first SPD module, wherein the first failure event comprises the first DIMM failure and associated first thermal telemetry data of the first DIMM;
adjusting, by the BMC, first DIMM thermal control settings to reduce a first temperature of the first DIMM based on the first failure events log including at least the first failure event; and
adjusting, by the BMC, second DIMM thermal control settings to set a second temperature of a second DIMM based on the first failure events log including at least the first failure event.

11. The method of claim 10, the method further comprising:
sending, by the BIOS, an indicator to the BMC indicating that a second DIMM failure of a second failure event has been detected, wherein the second failure event further comprises second thermal telemetry data of the first DIMM associated with the second DIMM failure;
setting, by the BMC, the first DIMM thermal control settings to set the first temperature of the first DIMM based on the indicator received from the BIOS indicating that the second DIMM failure of the second failure event has been detected and the first failure events log including at least the second failure event.

12. The method of claim 10, the method further comprising:
setting, by the BMC, CPU thermal control settings to set the temperature of a central processing unit (CPU) of the DIMM thermal control system based on the first failure events log including at least the first failure event.

13. The method of claim 10, wherein the first failure events log of the first SPD module further comprises:
a DIMM temperature during a warning threshold;
a DIMM temperature during a critical threshold;
a number of DIMM excursions exceeding an excursions limit;
a number of times a DIMM temperature has exceed a temperature threshold;
a number of warning excursions within one or more warning temperature ranges; and
a number of critical excursions within one or more critical temperature ranges.

14. The method of claim 10, wherein adjusting the first DIMM thermal control settings to reduce the first temperature of the first DIMM further comprises one or more of reducing a DIMM fan control target by a fan control reduction amount, reducing a DIMM closed loop thermal throttling (CLTT) high temperature value by a CLTT reduction amount, and reducing a CPU cooling target by a cooling reduction amount.

15. The method of claim 10, wherein adjusting the first DIMM thermal control settings to reduce first temperature of the first DIMM is further based on health parameters of the first DIMM.

16. The method of claim 15, wherein the health parameters comprise:
a number of spare DIMMs remaining;
past temperature excursions of the first DIMM; and
on-die error correcting code (ECC) error occurrences of the first DIMM.

17. The method of claim 10, wherein the first DIMM failure comprises one or more of:
a correctable error; and
an uncorrectable error.

18. The method of claim 10, wherein after the first failure event has been recorded in the first failure events log, when a consecutive error count of the first failure events log exceeds a consecutive error count threshold, resetting the consecutive error count to zero.

* * * * *